United States Patent [19]

Garskamp

[11] 4,234,961
[45] Nov. 18, 1980

[54] RECEIVER COMPRISING A TUNING MEMBER AND AN AUTOMATIC TUNING CORRECTION SUPPRESSION CIRCUIT

[75] Inventor: Arnoldus Garskamp, Eindhoven, Netherlands

[73] Assignee: U.S. Philips Corporation, New York, N.Y.

[21] Appl. No.: 892,789

[22] Filed: Apr. 3, 1978

[30] Foreign Application Priority Data

May 2, 1977 [NL] Netherlands .......................... 7704772

[51] Int. Cl.³ ............................ H04B 1/26; H03J 7/02
[52] U.S. Cl. .................................... 455/160; 455/173; 455/175; 455/192; 334/16
[58] Field of Search ................ 325/457, 465, 418–423, 325/453, 455, 459, 464, 468, 469; 334/16; 358/195; 340/324 R; 328/128; 455/173, 175, 182, 192, 160

[56] References Cited

U.S. PATENT DOCUMENTS

| | | | |
|---|---|---|---|
| 3,440,544 | 4/1969 | Pampel ................................. | 325/422 |
| 3,736,442 | 5/1973 | Miller et al. ......................... | 328/128 |
| 3,835,384 | 9/1974 | Liff ....................................... | 325/455 |
| 3,949,158 | 4/1976 | Rzeszewski et al. ................ | 358/195 |
| 3,968,437 | 7/1976 | Ong ...................................... | 325/422 |
| 4,122,395 | 10/1978 | Schotz et al. ........................ | 325/455 |

*Primary Examiner*—Marc E. Bookbinder
*Attorney, Agent, or Firm*—T. A. Briody; W. J. Streeter; E. W. Goodman

[57] ABSTRACT

By using a optical switch, which can be operated by the tuning knob of a receiver, signals can be obtained which accurately correspond to the operation of the tuning knob for switch-over of the receiver to a continuous manual tuning mode and for suppressing the automatic tuning correction during tuning.

1 Claim, 1 Drawing Figure

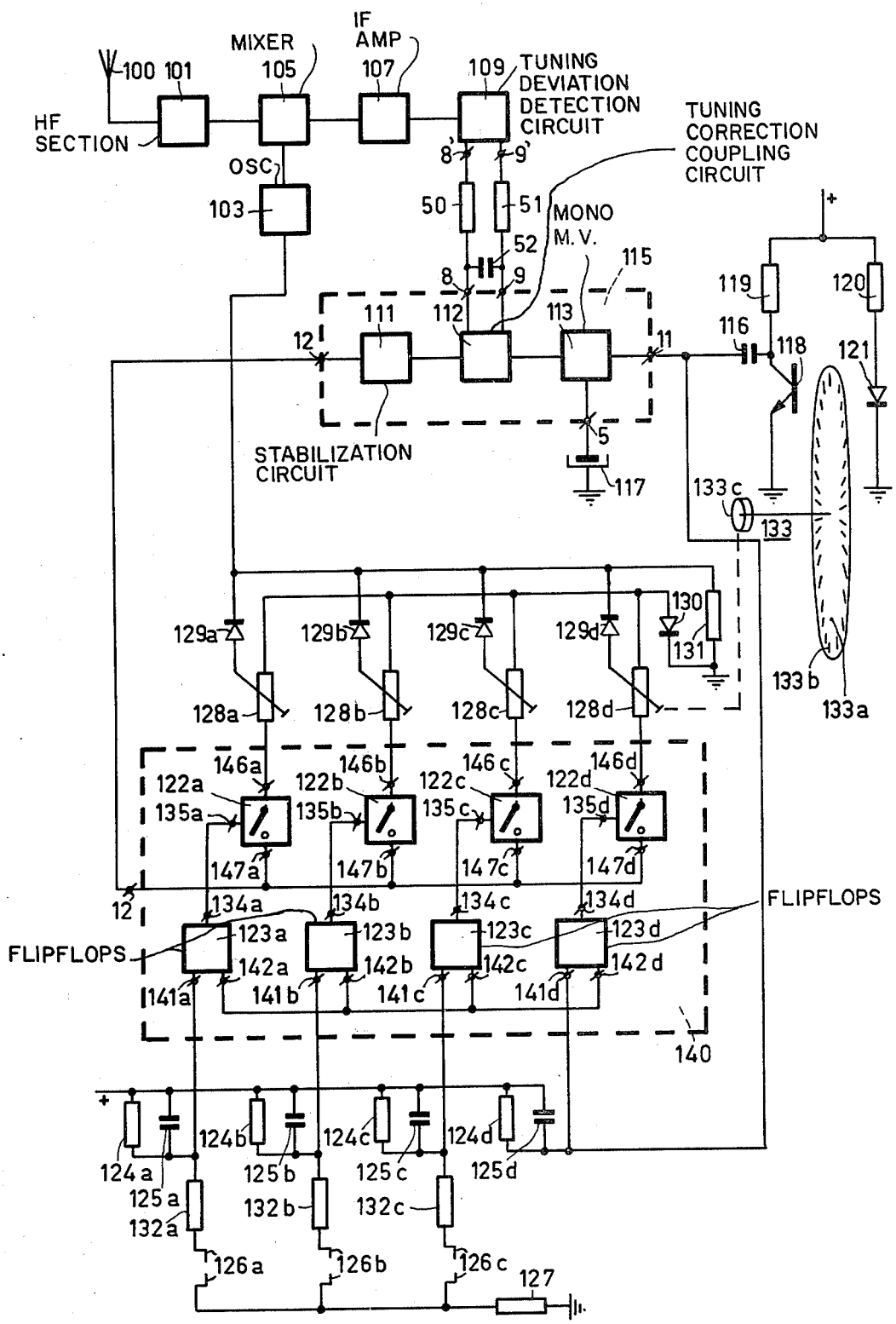

RECEIVER COMPRISING A TUNING MEMBER AND AN AUTOMATIC TUNING CORRECTION SUPPRESSION CIRCUIT

BACKGROUND OF THE INVENTION

The invention relates to a receiver comprising a tuning member and an automatic tuning correction suppression circuit for disabling the automatic tuning correction during the operation of the tuning member.

A receiver of the kind described above is known from U.S. Pat. No. 3,968,437, in which a control signal for the automatic tuning correction suppression circuit is obtained by differentiating and amplifying the voltage at an output of a potentiometer of the tuning member.

SUMMARY OF THE INVENTION

It is an object of the invention to provide a receiver of the kind mentioned in the preamble wherein a control signal for surpressing the automatic tuning correction is generated which is highly independent of the variation velocity of the tuning voltage when the tuning member is operated.

To this end a receiver according to the invention is characterized in that a control input of the automatic tuning correction suppression circuit is connected through a differentiating network to an output of a light-sensitive semiconductor, which is in a fixed position relative to a light-emitting element for illuminating the light-sensitive semiconductor, a light-interrupting element which is fixed to the tuning member being arranged in a movable manner relative to the light-sensitive semiconductor and the light-emitting element for hindering or not hindering, depending on its position, an optical connection between the light-sensitive semiconductor and the light-emitting element.

When applying the measure according to the invention, the state of the light-sensitive semiconductor is changed from a strong conducting state to a weak conducting or even blocked state or vice versa at the operation of the tuning member due to a reinstating or hindering of the optical connection between the light-sensitive semiconductor and the light-emitting element, because of a movement of the light-interrupting element. Because these changes take place rather abruptly, a pulse-shaped signal, of a considerably greater amplitude than the control signal for the prior art receiver, is obtained at the output of the differentiating network so that a lower gain is required for controlling the automatic tuning correction suppression circuit.

Operation of the tuning member detunes a tunable oscillator. The automatic tuning correction is intended to function over a given frequency range around the original tuning frequency. In practice it is advantageous to suppress the automatic tuning correction during tuning, before a frequency shift of 200 Khz relative to the original tuning frequency has taken place.

To this end an embodiment of a receiver in accordance with the invention is characterized in that that at a movement, effected by operating the tuning member, of the light-interrupting element from a position in which the light-sensitive semiconductor is optically connected to the light-emitting element to a next further position in which the light-sensitive semiconductor is screened from the light-emitting element or vice versa, the receiver tuning is detuned over a frequency range of not more than 200 Khz.

A further embodiment of a receiver according to the invention, which also comprises at least one preselection-adjusting member and a switch-over circuit for switching over the receiver tuning from tuning by means of the preselection-adjusting member to manual tuning by means of the tuning member, is characterized in that a control input of the switch-over circuit is connected via the differentiating network to the output of the light-sensitive semiconductor.

In this further embodiment the control pulse at the output of the differentiating network, giving an indication that the tuning member is operated and caused by the light-interrupting element interrupting or reinstating the optical connection between the light-sensitive semiconductor and the light-emitting element, is also used for switching the receiver-tuning over from the preselection-adjusting element to the tuning member.

DESCRIPTION OF THE DRAWING

The invention will be described by way of example with reference to the single FIGURE of the accompanying drawing.

The FIGURE illustrates, partly in block form, a receiver according to the invention.

DESCRIPTION OF THE PREFERRED EMBODIMENT

The illustrated receiver has a high-frequency section 101 which is connected to an aerial 100, a mixing circuit 105 coupled to this section 101 and to an adjustable oscillator 103. An intermediate frequency amplifier 107 is coupled to an output of the mixing circuit 105 and a tuning deviation detection circuit 109, such as, for example, a frequency or phase deviation detection circuit, is coupled to an output of the mixing circuit 105.

The receiver may be either a radio or a television receiver whose further signal processing sections are not important for understanding the invention and have been omitted for the sake of clarity.

The tuning deviation detection circuit 109 has outputs 8', 9' which are connected via resistors 50 and 51 to inputs 8, 9, which are shunted by a capacitor 52, of a tuning correction coupling circuit 112, which is included in a multi-stabilisation circuit 115 of an integrated circuit type TCA750. The numbers of the terminals (pins) of this TCA750 correspond to the reference numerals mentioned here, wherein only the terminals which are important for an understanding of the invention have been shown. For a more complete description, reference is made to "Philips Product Information" 60 dated Oct. 3, 1974. By means of a stabilization circuit 111 connected to the tuning correction coupling circuit 112, the TCA750 supplies a voltage to a terminal 12 onto which a tuning correction voltage (A.F.C.-voltage) is superimposed which is under the influence of the tuning correction signal (A.F.C.-signal) applied to the terminals 8,9. The tuning correction voltage can be made inactive by means of a sufficiently high (higher than 0.8 V) positive or negative voltage on an input 11 of a tuning correction suppression circuit 113 connected to the tuning correction coupling circuit 112. A capacitor 117 is connected by way of a terminal 5 of the TCA750 to the tuning correction suppression circuit 113. The capacitor 117 determines the delay with which the tuning correction voltage becomes active again after a tuning correction suppression signal at the input 11 has disappeared. The input 11 is connected via a coupling capacitor 116 to the collector of a phototransistor 118, which is connected to a supply voltage via a collector resistor 119. The emitter of the phototransistor 118 is connected to ground. The phototransistor 118 can be exposed to light from a light-emitting diode 121 which is arranged opposite to the phototransistor 118 for this purpose. When the phototransistor 118 receives light from the diode 121 the phototransistor is in a conducting state. If the phototransistor 118 does not receive light from the diode 121, it is in a more or less blocked state.

The anode of the diode 121 is connected via a resistor 120 to the supply voltage, the cathode of this diode 121 is connected to ground. Disposed between the phototransistor 118 and the diode 121 there is a light-interrupting element 133 which comprises a circular plate 133a of an opaque material, provided along the edge with radial slots 133b. A spindle, which is mechanically connected to a tuning knob 133c is fixed in the center of the plate 133a. Operating the tuning knob 133c results in a rotation of the plate 133a. One or more of the slots 133b can then pass the light radiated from the diode 121 to the phototransistor 118, so that one or more changes in light intensity occur for this phototransistor 118. Corresponding, one or more pulses are then produced at the collector of the phototransistor.

The terminal 12 of the multi-stabilisation circuit 115 is connected to an input 12' of a selection switching circuit 140 comprising a Philips integrated circuit type SAS 560. Only the terminals which are essential for understanding the invention are shown. For a more detailed description reference is made to "Valvo Handbook" of 1976, pages 19 to 24 inclusive.

The selection switching circuit 140 comprises electronic switches 122a to 122d inclusive, provided, respectively, with switching inputs 147a to 147d inclusive, switching outputs 146a to 146d inclusive and control inputs 135a to 135d inclusive. All the switching inputs 147a to 147d inclusive are coupled to the input 12', while the switching outputs 146a to 146c inclusive are coupled to variable potentiometers 128a to 128c inclusive respectively. The switching output 146d is coupled to a tuning potentiometer 128d which functions as tuning member.

The respective wipers of the variable potentiometers 128a to 128c inclusive, as well as the wiper of the tuning potentiometer 128d are coupled, via coupling diodes 129a to 129d inclusive, to both the tunable oscillator 103 and, through a resistor 131, to ground. The wiper of the tuning potentiometer 128d is mechanically connected to the tuning knob 133c. The variable potentiometers 128a to 128c inclusive and the tuning potentiometer 128d are connected to ground via a compensating diode 130. The compensating diode 130 compensates for the temperature dependency of the tuning voltage which is introduced by the coupling diode of the tuning voltage determining potentiometer.

The respective control inputs 135a to 135d inclusive are respectively connected to outputs 134a to 134d of bistable multivibrators 123a to 123d inclusive. These multivibrators 123a to 123d inclusive are provided with the respective control inputs 141a to 141d inclusive and with respective interconnected reset terminals 142a to 142d inclusive. Each of these multivibrators 123a to 123d has two stable states, namely a quiescent state in which a control signal at the output of the multivibrator opens the switch connected thereto and/or keeps it in the open state and a switching state in which a control signal at the output of the multivibrator closes the switch connected thereto and/or keeps it in the closed state. In the switching state the relevant multivibrator supplies a reset signal via the interconnected reset terminals 142a to 142d inclusive to the remaining multivibrators, by means of which these latter are brought to and/or kept in the quiescent state.

A multivibrator which is already in the quiescent state can only be brought into the switching state by a control pulse at its control input, in the quiescent state repeated reset signals at its reset terminals do not change its state. Likewise a multivibrator which is already in the switching state can only be brought to the quiescent state by means of a reset signal at its reset terminals, in the switching state repeated pulses at its control input do not change its state.

The control inputs 141a to 141c are connected via respective parallel RC-circuits 124a, 125a to 124c, 125c inclusive, to a supply voltage and via resistors 132a to 132c inclusive to touch contacts 126a to 126c inclusive. These touch contacts 126a to 126c are connected to ground via a safety resistor 127. A control pulse for one of the multivibrators 123a to 123c inclusive is obtained by touching the touch contacts 123a to 123c connected thereto. By choosing a high value for the resistors 132a to 132c inclusive and the safety resistor 127, that is to say some MOhms, touching the touch contacts 123a to 123c can be done without any risk.

The input 141d of the multivibrator 123d is connected, via a parallel RC-circuit 124d, 125d to the supply voltage and to the connection between the input 11 of the multistabilisation circuit 115 and the coupling capacitor 116.

By means of the RC-members 124a, 125a to 124d, 125d inclusive, any disturbing pulses on the supply voltage, for example due to static discharges at the touch contact 126a to 126c inclusive, are prevented from setting the multivibrators 123a to 123d inclusive into the switching state.

As mentioned above, when the tuning member 128d is operated by means of the tuning knob 133c, one or more slots 133b pass the optical connection between the phototransistor 118 and the diode 121, which produces a pulse or a pulse train. The coupling capacitor 116 together with the input impedance at the input 11 of the multi-stabilisation circuit 115 form a differentiating network which causes this pulse or pulse train to be differentiated.

Because the slots 133b of the light-interrupting element 133 cause a rather abrupt change in the light intensity on the phototransistor 118 so that the pulses produced at the collector of the phototransistor 118 are substantially rectangular, the differentiated pulses are of a sufficiently great amplitude to control the tuning correction suppression circuit 113 without further amplification. This tuning correction suppression circuit 113 comprises a monostable multivibrator which is adjusted from a quiescent state to a switching state by a pulse supplied by the phototransistor 118 via the coupling capacitor 116 to the input 11. After a time constant, which is adjustable by means of the value of the capacitor 117, this monostable multivibrator returns again to the quiescent state. If a pulse train is supplied to the input 11 in which the time between pulses is smaller than said time constant the monostable multivibrator remains in the switching state during the occurrence of the pulses and does not return to the quiescent state until a period of time corresponding to the time constant has transpired after the last pulse of this pulse train.

In the switching state of said monostable multivibrator, the tuning correction voltage generated by the tuning deviation detection circuit 109 is suppressed in the tuning correction coupling circuit 112, which is coupled to the tuning correction suppression circuit 113. Then the tuning correction voltage is not coupled to the stabilisation circuit 111 so that the voltage at the output 12 has a constant value. A tuning voltage derived from this voltage is, consequently, also constant, a tuning correction voltage being missing therefrom.

After having been differentiated in the differentiating network formed by the coupling capacitor 116 and the input impedance of the multistabilisation circuit 115, the pulses, produced at the collector of the phototransistor 118 as a result of the above-mentioned operation of the tuning member 128d, are also passed to the control input 141d of the multivibrator 123d. As a result, this multivibrator 123d is set to and/or remains in the switching state. A reset signal which reset to and/or keeps the multivibrators 123a to 123c inclusive in the quiescent state is supplied to the reset terminal 142d. A control signal at the output 134d of the multivibrator 123d closes the switch 122d so that the voltage at the input 12' of the selection switching circuit 140 is passed on to the tuning potentiometer 128d and the tuning voltage is determined by the voltage at the wiper of this tuning potentiometer 128d.

An operation of the tuning knob 133c has two consequences: the control of the tunable oscillator 103 automatically switches over to the tuning potentiometer 128d and, in addition, the tuning correction voltage in the tuning voltage is suppressed during the operation until a certain period of time, determined by the time constant of the monostable multivibrator included in the tuning correction suppression circuit 113, has elapsed after this operation.

In a practical embodiment of the receiver shown in FIG. 1 a so-called optical switch of the trademark Monsanta, type MCA8, was used for the phototransistor 118 and the light-emitting diode 121, in which optical switch a phototransistor is disposed opposite to a light-emitting diode, separated by a gap in which the circular plate 133a of the light-interrupting element 133 is arranged in a movable manner.

In this embodiment the plate 133a has a diameter of 32 mm and is provided at the edge with 32 slots 133b, which are distributed equidistantly along the circumference. In the illustrated receiver, an operation of the tuning knob 133c in such a way that the circular plate rotated over one slot spacing, results in a 30 KHz shift of the tuning frequency.

An integrated circuit of the type TCA750 is used for the multistabilisation circuit 115 and an integrated circuit of the type SAS560, for the selection switching circuit. The decoupling diodes 129a to 129d inclusive, as well as the compensating diode 130 are of the type BA127.

The remaining elements shown in the drawing have the following values:

| Resistors: | Value: | Capacitors: | Value: |
|---|---|---|---|
| 50 | 100 kOhm | 52 | 47 nF |
| 51 | 100 kOhm | 116 | 470 nF |
| 119 | 15 kOhm | 117 | 8 μF |
| 120 | 4.7 kOhm | 125a to 125d incl. | 560 μF |
| 128a to 128d incl. | 30 kOhm | | |
| 131 | 1 MOhm | | |
| 124a to 124d incl. | 3.3 MOhm | | |
| 132a to 132d incl. | 10 MOhm | | |
| 127 | 5.6 MOhm. | | |

An equivalent construction of the before-mentioned optical switch is one of the type MCA7. In the latter type optical switch, the phototransistor and the light-emitting diode are arranged in the same plane. The light of the diode can reach the phototransistor via a reflecting plane opposite to both the diode and the phototransistor. The circular plate of the light-interrupting element 133 must then be provided with alternate reflecting and light-absorbing strokes.

It will be clear that the use of the TCA750 and the SAS560 is not a condition for the use of the invention. It goes without saying that other circuits having comparable functions can be used.

What is claimed is:

1. A receiver having a tuning member, an automatic tuning correction circuit and an automatic tuning correction suppression circuit for disabling said automatic tuning correction circuit when said tuning member is operated, said receiver further comprising a light-emitting element, a light-sensitive semiconductor arranged in a fixed position relative to said light-emitting element for the illumination thereby, a light-interrupting element operatively coupled to said tuning member and arranged in a movable manner, relative to said light-sensitive semiconductor and said light-emitting element, for selectively blocking, depending upon the position thereof, the light passing from said light-emitting element to said light-sensitive semiconductor, a differentiating network coupled to said light-sensitive semiconductor for differentiating the output thereof, said suppression circuit being coupled to an output of said differentiating circuit at least one preselection-adjusting element, and a switch-over circuit coupled to said preselection-adjusting element for switching over the receiver tuning from said preselection-adjusting element to manual tuning by said tuning member, wherein said switch-over circuit includes a control input coupled to said differentiating network whereby movement of said tuning member will result in a differentiated signal from said light-sensitive semiconductor for activating said switch-over circuit and for providing said automatic tuning correction suppression.

* * * * *